United States Patent [19]
Cochran et al.

[11] Patent Number: 5,942,901
[45] Date of Patent: Aug. 24, 1999

[54] ELECTRICAL TRANSFER SWITCH

[75] Inventors: John Cochran, Fort Wayne, Ind.; Mike Konruff, Burlington, Wis.; Adam Peplinski, Big Bend, Wis.; Roger L. Perry, Franksville, Wis.

[73] Assignee: RPI, Inc., Racine, Wis.

[21] Appl. No.: 09/001,236

[22] Filed: Dec. 30, 1997

Related U.S. Application Data

[62] Division of application No. 08/682,148, Jul. 17, 1996, Pat. No. 5,773,983.

[51] Int. Cl.[6] .............................. H01H 15/02; G01R 1/02
[52] U.S. Cl. ..................... 324/555; 200/16 E; 200/51.12; 340/805.03; 439/43; 439/374
[58] Field of Search ..................................... 324/527, 555, 324/158.1, 754; 200/175, 176, 177, 178, 16 A, 16 R, 16 B, 16 E, 537, 538, 51 B, 51.02, 51.12, 81 R, 82 R, 82 A; 340/826, 825.03, 825.79; 439/43, 49, 374; 335/127, 106, 107, 131; 307/112

[56] References Cited

U.S. PATENT DOCUMENTS

| | | |
|---|---|---|
| 2,685,010 | 7/1954 | Boterweg et al. . |
| 3,280,275 | 10/1966 | Sheffield et al. . |
| 3,341,671 | 9/1967 | Anater et al. . |
| 3,493,697 | 2/1970 | Sedory . |
| 3,997,743 | 12/1976 | Hock et al. . |
| 4,395,610 | 7/1983 | Downs et al. ........................... 200/292 |
| 4,618,755 | 10/1986 | Wallace ................................... 200/175 |
| 4,692,578 | 9/1987 | Wallace ................................... 200/175 |
| 5,403,420 | 4/1995 | Gall et al. ............................... 156/182 |
| 5,469,001 | 11/1995 | Vaillant .................................. 307/113 |
| 5,644,115 | 7/1997 | Knauer ................................... 200/175 |

*Primary Examiner*—Michael Brock
*Attorney, Agent, or Firm*—Jansson, Shupe, Bridge, Munger, Ltd.

[57] ABSTRACT

The disclosure involves a transfer switch having a stationary frame and a front terminal matrix for connection to circuit boards undergoing test. There are two stationary connectors mounted on the switch frame. A platform is supported by the frame for reciprocating movement between first and second positions. Such platform has two movable connectors thereon and when the platform is in the first position, one of the movable connectors engages or "plug-connects" to one of the stationary connectors. When the platform is in the second position, the other movable connector plug connects to the other stationary connector. The stationary connectors are electrically coupled to respective test devices, e.g., a load board and a signal bus. Thus, the boards under test can be connected to one or the other of the test devices by shifting the position of the platform. A new method is also disclosed.

10 Claims, 5 Drawing Sheets

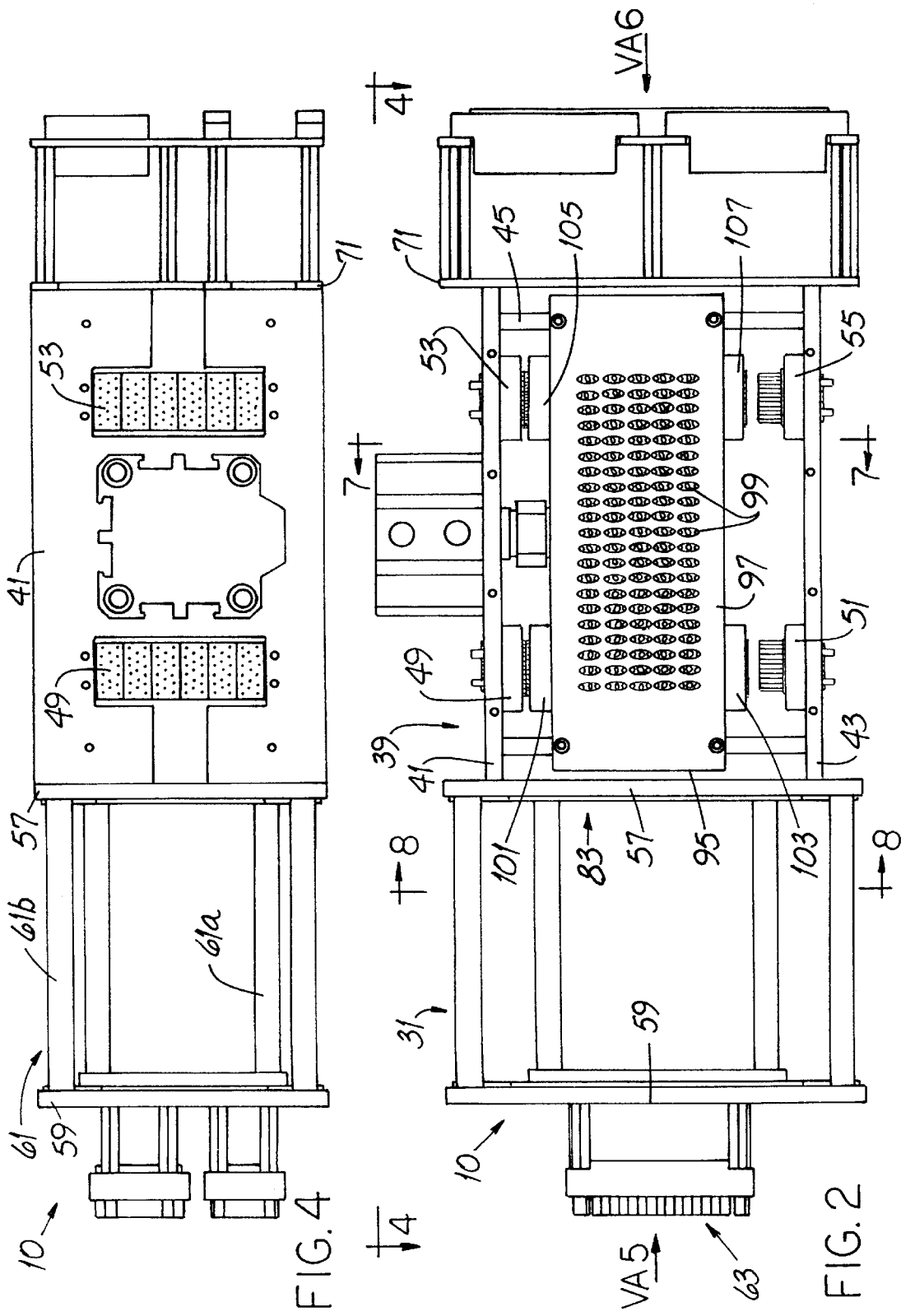

ELECTRICAL TRANSFER SWITCH

RELATED APPLICATION

This application is a division of application Ser. No. 08/682,148 filed on Jul. 17, 1996, now U.S. Pat. No. 5,773,983.

FIELD OF THE INVENTION

This invention relates generally to apparatus for making and breaking electrical circuits and, more particularly, to such an apparatus for simultaneously making or breaking a relatively large number of such circuits.

BACKGROUND OF THE INVENTION

Depending upon the circuit board application, purchasers of electronic printed circuit boards (PCBs) may require no more than routine reliability or, in sharp contrast, may require a very high degree of reliability. A toy having a PCB would be in the former category while military aircraft, certain automotive applications and the like would clearly be in the latter.

One way to help assure a high level of reliability (or, conversely, to cull out PCBs which may exhibit "infant mortality" or premature failure) is to "stress screen" them. Such screening is by placing the PCBs in a chamber, the interior air temperature of which is repetitively cycled between about 120° C. and about −60° C. over a relatively-short period of time, i.e., well less than one hour or so.

In one exemplary test chamber arrangement, the chamber has a removable wall mounted on and forming a component of a wheeled cart. That side of the wall at the chamber interior has a fixture for mounting PCBs thereon during test. On the opposite side of the wall, the cart has a rack on which instruments or the like are mounted. Feedthrough devices extend through separate respective openings in the removable wall and connect to PCBs in the fixture and to the instruments on the rack. This arrangement is used in a known test method including connecting the PCBs to instruments during stress screening—no switching is involved. In the parlance of the industry, this is known as Class A testing.

Another known PCB testing method includes switching the PCBs between a load board and a signal bus while such PCBs are undergoing thermal stress screening. Individual relays are used to switch each electrical lead. Since each relay can handle but a single circuit, the number of relays required is, in general, equal to the number of wires or leads extending from the PCBs under test. Thus, installations with more than 100 relays are common. Relays can be troublesome, both from the standpoint of undesirably-high contact resistance and with respect to reliability.

Heretofore, those conducting "switched" testing as well as non-switched or Class A testing purchased (and stored and maintained) two carts, one configured for PCB switching and the other configured for Class A testing. A leading manufacturer of such carts and related equipment is RPI, Inc. of Racine, Wis.

OBJECTS OF THE INVENTION

It is an object of the invention to provide a transfer switch and related method overcoming some of the problems and shortcomings of the prior art.

Another object of the invention is to provide a transfer switch and related method which result in substantially improved reliability.

Another object of the invention is to provide a transfer switch which exhibits decreased contact resistance.

Yet another object of the invention is to provide a transfer switch capable of switching a large number of electrical circuits simultaneously.

Another object of the invention is to provide a transfer switch and related method which are useful for both switched testing and Class A testing.

Still another object of the invention is to provide a transfer switch and related method useful in cart-based stress testing to reduce the number of carts required to be used. How these and other objects are accomplished will become more apparent from the following descriptions and from the drawings.

SUMMARY OF THE INVENTION

Aspects of the invention involve a switch which transfers wired connections from printed circuit boards undergoing test to either a first or a second device for testing the boards. This type of stress screening is sometimes referred to as a "burn-in" test. In a specific embodiment, the devices may comprise a load board and a signal bus, respectively. The switch is capable of transferring a large number of wired connections, e.g., 200 or so, simultaneously.

The switch has a frame with plate-like first and second spaced-apart mounting members. There are first and second stationary connectors which are respectively supported by such mounting members. Parallel guide posts (four in the preferred embodiment) extend between the mounting members and function as bearing shafts for the moving platform described below.

The switch also has an actuator-positioned platform supported by the frame for reciprocating movement between a first position and a second position. Such platform slides along the guide posts when the platform moves with respect to the frame.

The platform has first and second movable connectors mounted on it. Such connectors are movable in the sense that they move with the platform rather than being movable with respect to the platform.

When the platform moves to the first position, the first connectors engage with one another and when the platform moves to the second position, the second connectors engage with one another. More specifically, the first connectors engage with one another by "plug connecting" the first movable connector on the platform to the first stationary connector on the first mounting member. In the alternative, the second movable connector is plug-connected to the second stationary connector. In turn, the first and second stationary connectors are electrically coupled by wiring harnesses or the like to respective test devices, i.e., to the exemplary load board and signal bus, respectively.

A linear actuator, e.g., a pneumatic or hydraulic cylinder or an electrical solenoid, extends between the second mounting member and the platform for moving the platform between the first and second positions. The actuator has a body fixed with respect to the second mounting member and a reciprocating portion (a piston or solenoid armature, for example) extending between the body and the platform.

In another aspect of the invention, the switch platform has a plurality of terminals supported thereon. In a preferred embodiment, the terminals are on one or two boards configured somewhat like printed circuit boards. However, there are no printed circuits thereon and each terminal is slightly spaced from and electrically isolated from all other terminals.

Each terminal is electrically coupled to the movable connectors on the platform and to an input terminal matrix at what is referred to as the front of the switch. Such matrix is connected (by means described below) to the printed circuit boards undergoing test.

In an exemplary application, the new transfer switch is used in combination with the load board and signal bus mentioned above and with an environmental test chamber containing circuit boards to be tested. Such chamber has a relatively-thick insulated wall with at least one opening through it. The switch includes a feedthrough portion which is fixed with respect to the frame and which extends through the wall opening. Such feedthrough portion has an input terminal matrix fixed thereon and coupled to the circuit boards. The load board is electrically coupled to the first stationary connector and the signal bus is electrically coupled to the second stationary connector.

The circuit boards are connected through the terminal matrix to the platform terminals by "hard" wiring. The platform terminals are connected to both the first and second movable connectors on the platform. Similarly, the first and second stationary connectors are electrically coupled to the first and second test devices, respectively.

When the switch platform is in the first position, the circuit boards under test are connected through the hard wiring to the terminals and thence to the first stationary connector via the first movable connector and to the first test device. And when the switch-platform is shifted to the second position, the circuit boards under test are connected via the hard wiring to the terminals and thence to the second stationary connector via the second movable connector and to the second test device. Stated another way, the printed circuit boards can be connected to either test device by reciprocating the actuator and the platform. In an actual test, the platform may be reciprocated hundreds or even thousands of times to test a particular batch of printed circuit boards in the test chamber.

Another aspect of the invention involves the combination of (a) a cart, (b) a plurality of transfer switches mounted on the cart, and (c) an environmental test chamber containing circuit boards to be tested. Each transfer switch includes a frame, a reciprocating platform and stationary and movable connectors as described above.

The test chamber includes a wall having a plurality of sockets mounted thereon. The cart and its transfer switches are spaced from the chamber and there is a separate cable harness extending between each socket and a respective transfer switch.

In one specific embodiment, the cable harness connects to a terminal matrix on the transfer switch. In another specific embodiment (configured to reduce contact resistance to a minimum), the cable harness is "hard-wired" and connects directly to the terminals on the platform without using an intervening terminal matrix.

Another aspect of the invention involves a new method for testing printed circuit boards. Such method includes the steps of providing a transfer switch electrically connected to the circuit boards and having a platform mounted for reciprocating movement between a first position and a second position. Also provided are first and second test devices which are fixed with respect to the platform. The platform is moved to the first position, thereby connecting the circuit boards to the first test device and then such platform is moved the second position, thereby connecting the circuit boards to the second test device.

In a more specific aspect of the method, the platform includes a plurality of terminals supported thereon. The switch includes an input terminal matrix fixed with respect to the platform. Wires extend between the matrix and the terminals and the first moving step includes flexing the wires in a first direction. The second moving step includes flexing the wires in a second direction.

Minimized wire flexure is an advantage of the new switch and the new method related thereto. The wires include a first wire extending along a first wire axis when the platform is in the first position and extending along a second wire axis when the platform is in the second position. Both wire axes are slightly angular with respect to the switch long axis. The included angle between the wire axes is less than about 10°. And depending upon the length of the switch and the particular wire being considered, the including angle between the wire axes may be even less than 5° or so.

In yet another aspect of the new method, the first moving step includes repositioning the movable platform connectors along an axis coincident with the stationary connectors. And most preferably, the platform is reciprocated in two directions which are 180° apart.

Other aspects of the invention are set forth in the following detailed description and in the drawings.

BRIEF DESCRIPTION OF THE DRAWINGS

FIG. 2 is a side elevation view of the transfer switch.

FIG. 4 is a top plan view of the switch of FIG. 2 taken along the viewing plane 4—4 thereof.

DETAILED DESCRIPTION OF PREFERRED EMBODIMENTS

Figure 1:
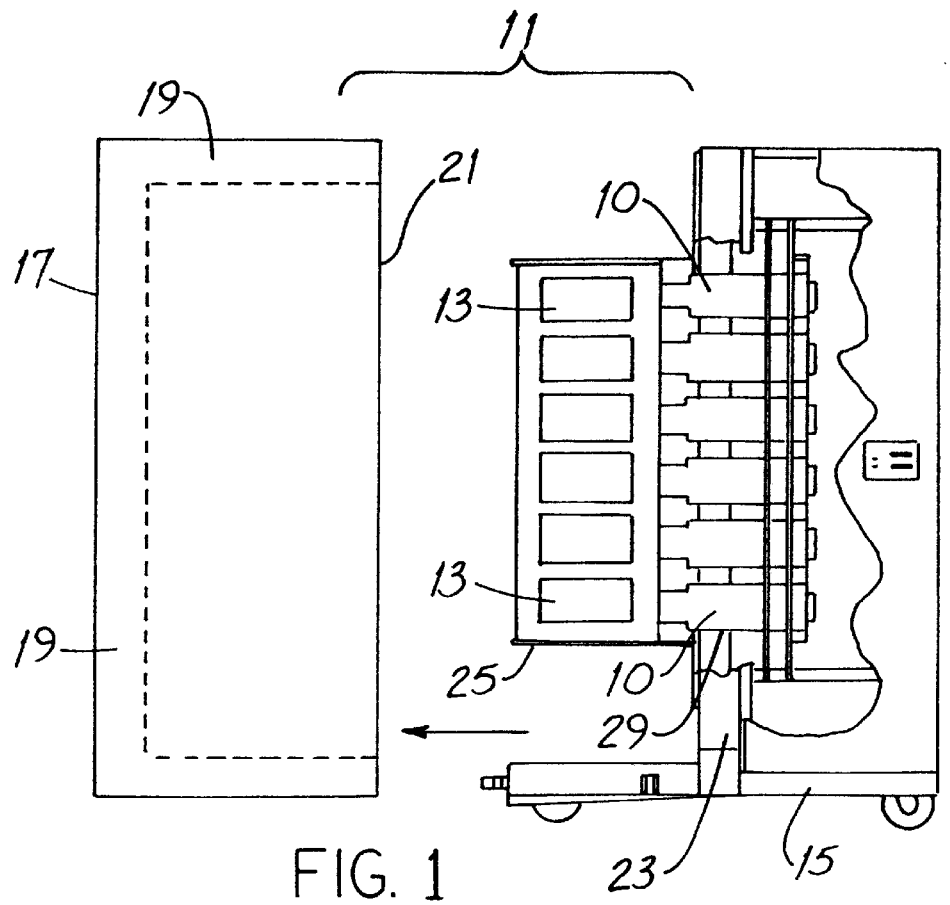
FIG. 1 is a side elevation view of one type of an exemplary cart-based circuit board test system with which the new transfer switch may be used.
Figure 3:
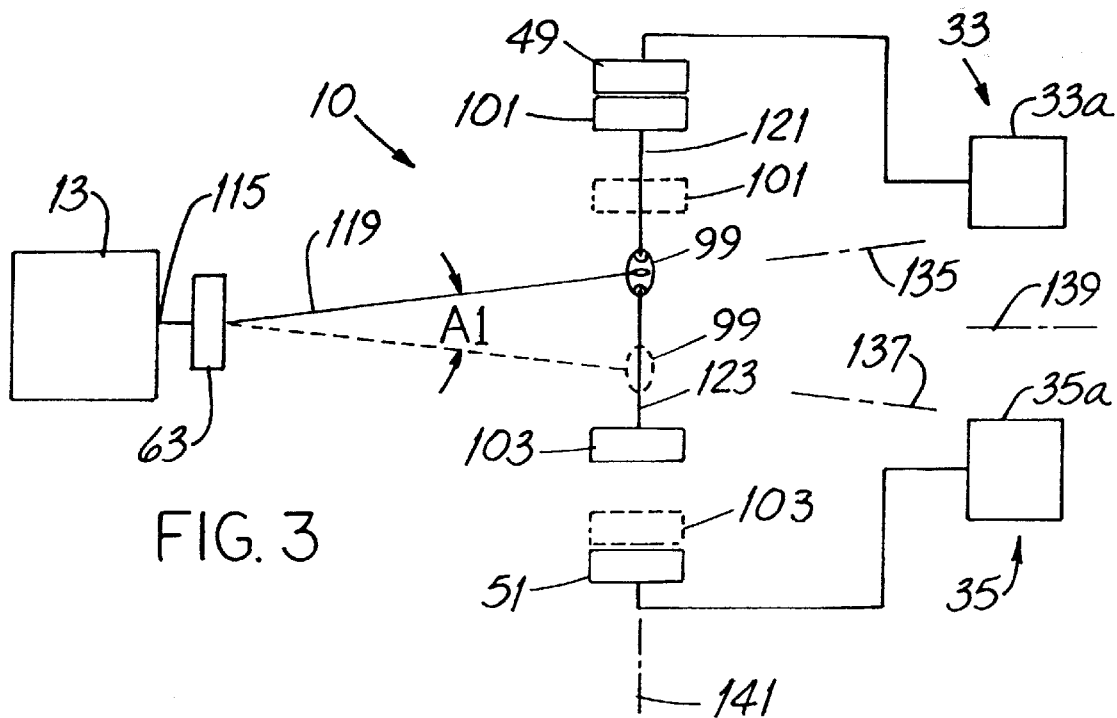
FIG. 3 is a representative side elevation view showing aspects of the transfer switch of FIG. 2.

Before describing the new transfer switch 10 in detail, it will be helpful to have an understanding of one of the ways in which such switch 10 may be used. Referring first to FIGS. 1, 2 and 3, FIG. 1 shows a cart-based system 11 for stress-screening printed circuit boards 13. Such system 11 includes a wheel-mounted cart 15 and a companion test chamber 17 having insulated walls 19 and an open side 21. The cart 15 has an upright wall 23 and the open side 21 and the wall 23 are cooperatively configured so that such wall 23 fits snugly into the open side 21 during testing.

Mounted on the inward side of the wall 23 is a fixture 25 for supporting a number of printed circuit boards 13. The wall 23 has several openings 29 through it, each of which has a feedthrough portion 31 of a transfer switch 10 extending therethrough. In a system 11 used to transfer the printed circuit boards 13 between first and second test devices 33, 35, e.g., a load board 33a and a signal bus 35a, respectively, the system 11 also includes such devices 33, 35. The new switch 10 is capable of transferring a large number of wired connections simultaneously. In a specific embodiment, two hundred or so connections may be switched.

Referring also to FIGS. 4, 5, 6, 7 and 8, the new switch 10 will now be described. The switch 10 has a frame 39 with substantially planar, plate-like first and second spaced-apart mounting members 41, 43, respectively. Four parallel guide posts 45 extend between the mounting members 41, 43, are arranged in a four-corner pattern defining the corners of a rectangle and function as bearing shafts for the moving platform described below.

First and second stationary connectors 49 and 51, respectively, are mounted on and supported by the mounting members 41 and 43, respectively. In a highly preferred embodiment, such connectors 49, 51 are 102-pin modular male connectors available from Hypertronics Co. And while the switch 10 functions quite satisfactorily with the connectors 49, 51 to switch up to about 100 circuits simultaneously, a highly preferred embodiment of the switch 10 includes third and fourth stationary connectors 53 and 55, respectively. Such connectors 53, 55 are of the type described above.

Forward of the mounting members 41, 43 is a feedthrough portion 31 having a front plate 57 and a holding plate 59 with rod-like supports 61 extending therebetween. A specific embodiment includes four inward supports 61a arranged in a four-corner pattern and four similarly-arranged outward supports 61b. Mounted at the front of the switch 10 is a terminal matrix 63 comprising a 120-contact female connector 65 and a 90-contact female connector 67, both available from Elco.

Mounted at the rear of the switch 10, rearward of the end plate 71 spanning the mounting members 41, 43, is a pair of vertically-spaced 104-pin receptacle housings 73, 75 as made by Amp, Inc. Such housings 73, 75 may be used to connect a test device 35, e.g., a signal bus 35a, to the switch 10 and to the boards 13 undergoing test.

Adjacent to the housings 73, 75 is a pair of spaced, parallel 100-pin edge card connectors 77, 79 as made by Sullins. Such edge card connectors 77, 79 may be used to connect another test device 33, e.g., load boards 33a, to the switch 10 and to the boards 13 undergoing test.

Figure 7:
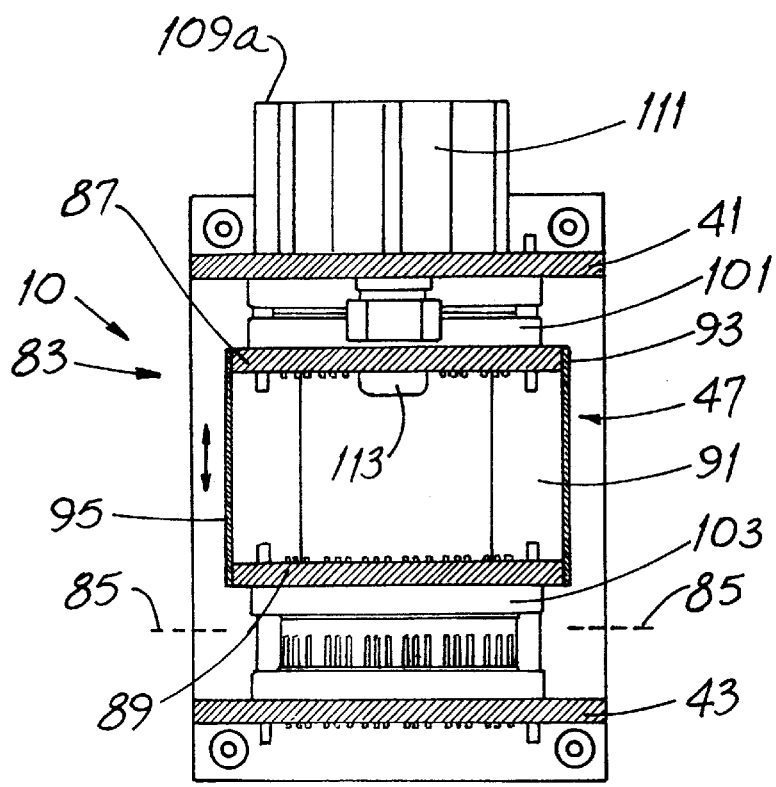
FIG. 7 is a cross-sectional elevation view of the switch of FIG. 2 taken along the viewing plane 7—7 thereof.

Details of the switch platform 47 will now be set forth. Referring particularly to FIGS. 2 and 7, an actuator-positioned platform 47 is supported by the frame 39 for reciprocating movement between a first or upward position 83 shown in solid outline and a second or downward position represented by the dashed line 85. Such platform 47 slides along the guide posts 45 when the platform 47 moves with respect to the frame 39.

As shown FIG. 7, the platform 47 has first and second mounting plates 87, 89, respectively, which are parallel to one another and spaced apart. Bearing blocks 91 are fastened to and extend between such plates 87, 89 for providing platform rigidity.

Figure 9:
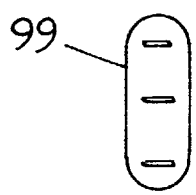
FIG. 9 is an enlarged view of a terminal lug, one of a large number of such lugs used on the switch of FIG. 2.
Figure 5:
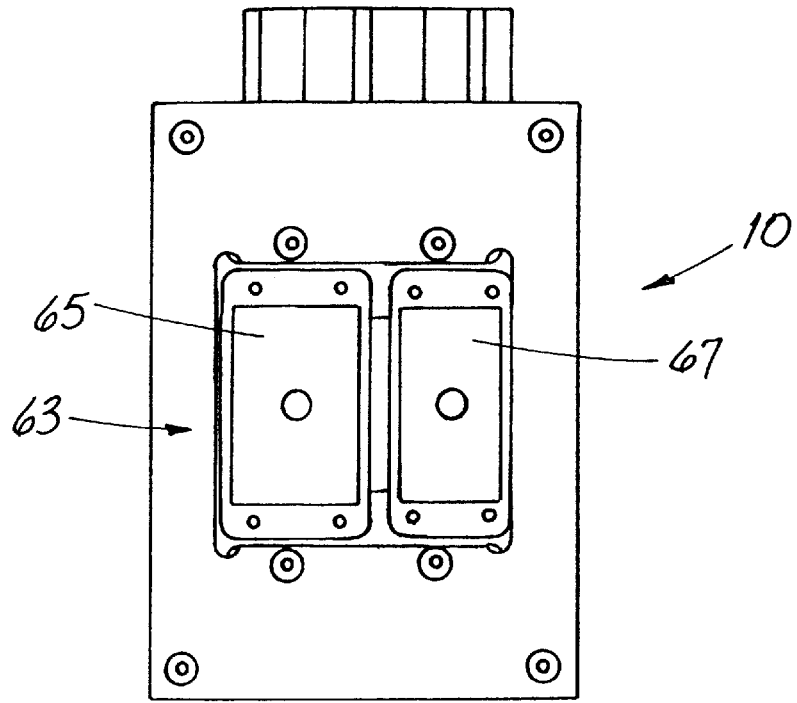
FIG. 5 is a front elevation view of the switch of FIG. 2 taken along the viewing axis VA5 thereof.

The platform 47 also includes a pair of terminal boards 93 and 95 extending between vertically-spaced edges of respective mounting plates 87, 89. Each such terminal board 93, 95 has an insulating substrate 97 and a plurality of three-point lugs 99 thereon as shown in FIG. 9. Each lug 99 is made of electrically-conductive material, is supported by the substrate 97 and is electrically isolated from other lugs 99. The purpose of such lugs 99 is described below.

Referring again to FIGS. 2 and 7, the platform 47 has first and second movable connectors 101, 103, respectively, mounted on the first and second mounting plates 87, 89, respectively. In a highly preferred embodiment, such connectors 101, 103 are 102-pin modular female connectors available from Hypertronics Co. And while the switch 10 functions well with the connectors 101, 103 to switch up to about 100 circuits simultaneously, a highly preferred embodiment of the switch 10 includes third and fourth movable connectors 105 and 107, respectively. Such connectors 105, 107 are of the 102-pin type described immediately above.

Figure 8:
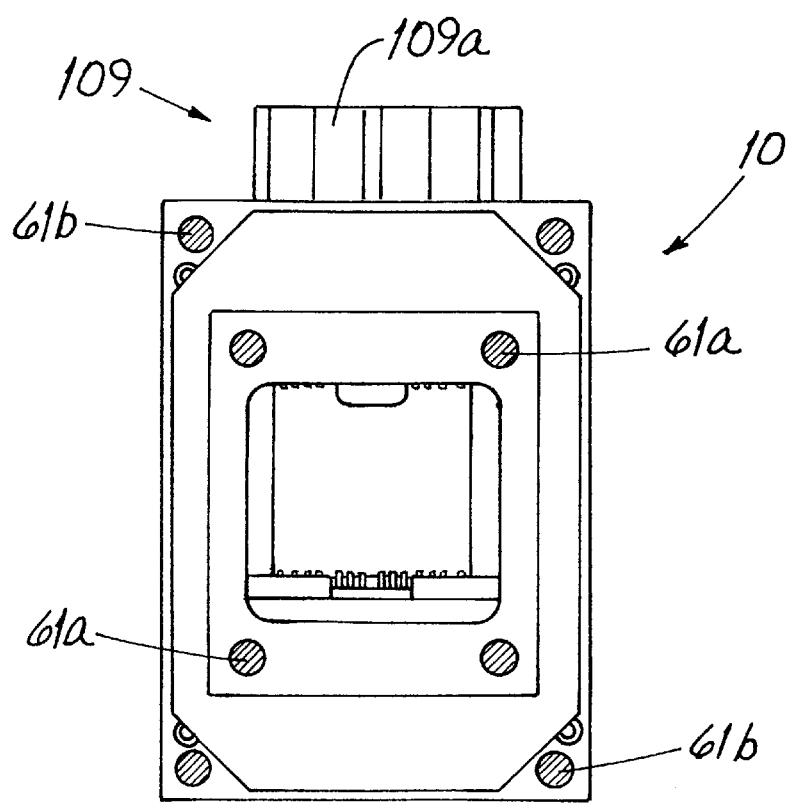
FIG. 8 is a cross-sectional elevation view of the switch of FIG. 2 taken along the viewing plane 8—8 thereof.
Figure 6:
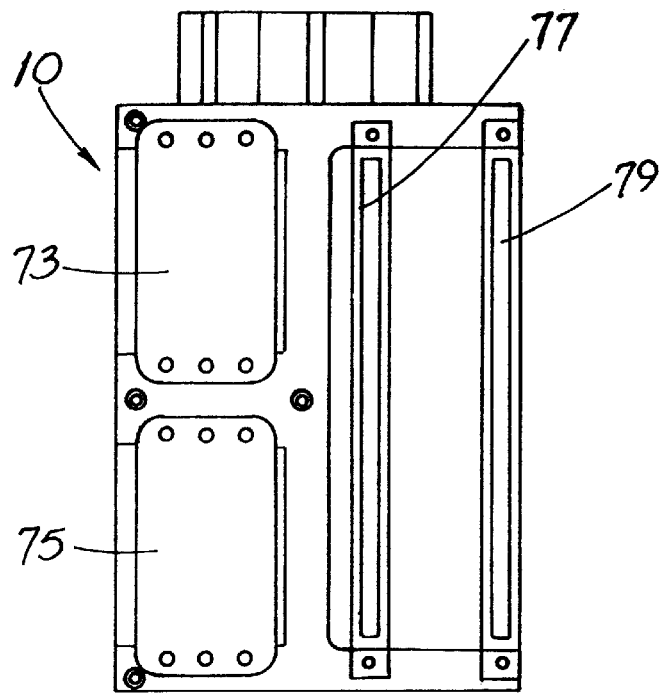
FIG. 6 is a rear elevation view of the switch of FIG. 2 taken along the viewing axis VA6 thereof.

Referring now to FIGS. 2, 7 and 8, a linear actuator 109, e.g., a pneumatic or hydraulic cylinder 109a or an electrical solenoid, extends between the first mounting member 41 and the platform 47 for moving the platform 47 between the first and second positions 83, 85. The actuator 109 has a body 111 attached to the first mounting member 41 and a reciprocating portion 113 (a piston or solenoid armature, for example) extending between the body 111 and the platform 47. When the reciprocating portion 113 is retracted, the platform 47 is in its first or upward position 83 and when such portion 113 is extended, the platform 47 is in its second or downward position 85.

When the platform 47 moves to the first position 83, the first and third movable connectors 101, 105 plug connect to the first and third stationary connectors 49, 53, respectively. And when the platform 47 moves to the second position 85, the second and fourth movable connectors 103, 107 plug-connect to the second and fourth stationary connectors 51, 55 respectively.

FIGS. 3 and 7 and the following description explain how the switch 10 is used to connect a printed circuit board 13 under test with either of two test devices 33, 35, e.g., the exemplary load board 33a or signal bus 35a. While the connection arrangement is shown for only a single electrical point 115 on the printed circuit board 13, it is to be appreciated that there may be on the order of 200 such points 115, each connectable to the load board 33a or to the signal bus 35a by energizing the actuator 109 and moving the platform 47.

In one embodiment, the electrical point 115 is coupled to the terminal matrix 63 from which a wire 119 extends to a lug 99. A wire 121 also extends between the lug 99 and the first movable connector 101 and another wire 123 extends between such lug 99 and the second movable connector 103. The positions of the connectors 101, 103 and lug 99 shown in solid outline are those when the platform 47 is in its first position 83. And the positions of the connectors 101, 103 and lug 99 shown in dashed outline are those when the platform 47 is in its second position 85. Of course, the first and second stationary connectors 49, 51 do not move with platform movement.

Figure 10:
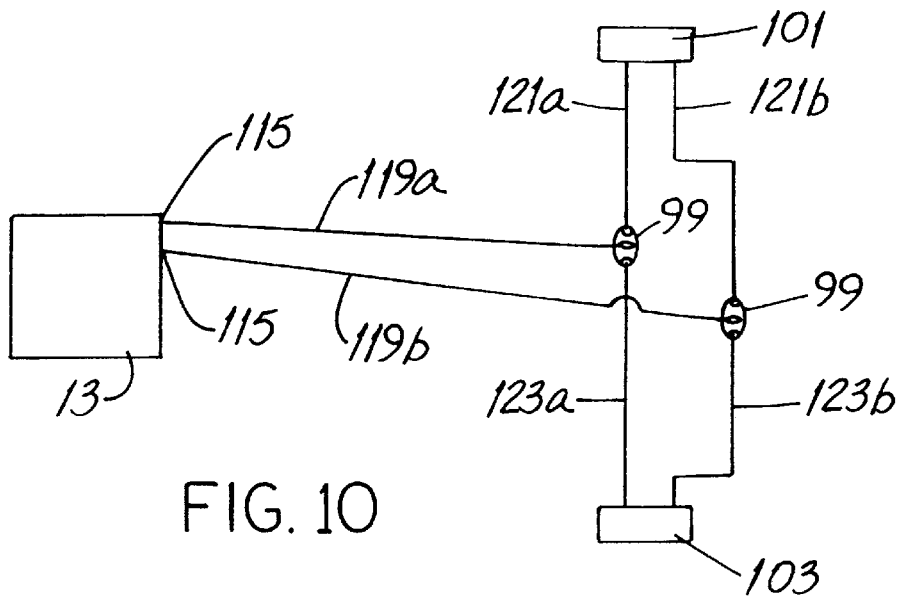
FIG. 10 is a representative side elevation view generally like that of FIG. 3 and showing other aspects of the transfer switch of FIG. 2.

In another embodiment shown in FIG. 10, the switch 10 is free of a terminal matrix 63 and each electrical point 115 is coupled directly to a separate lug 99 by a separate wire 119a, 119b. Wires 121a, 121b, 123a, 123b also extend between each lug 99 and the first and second movable connectors 101, 103. In this embodiment, the contact resistance otherwise imposed on the circuit by the terminal matrix 63 (which in any event is quite low) is nevertheless avoided.

Figure 11:
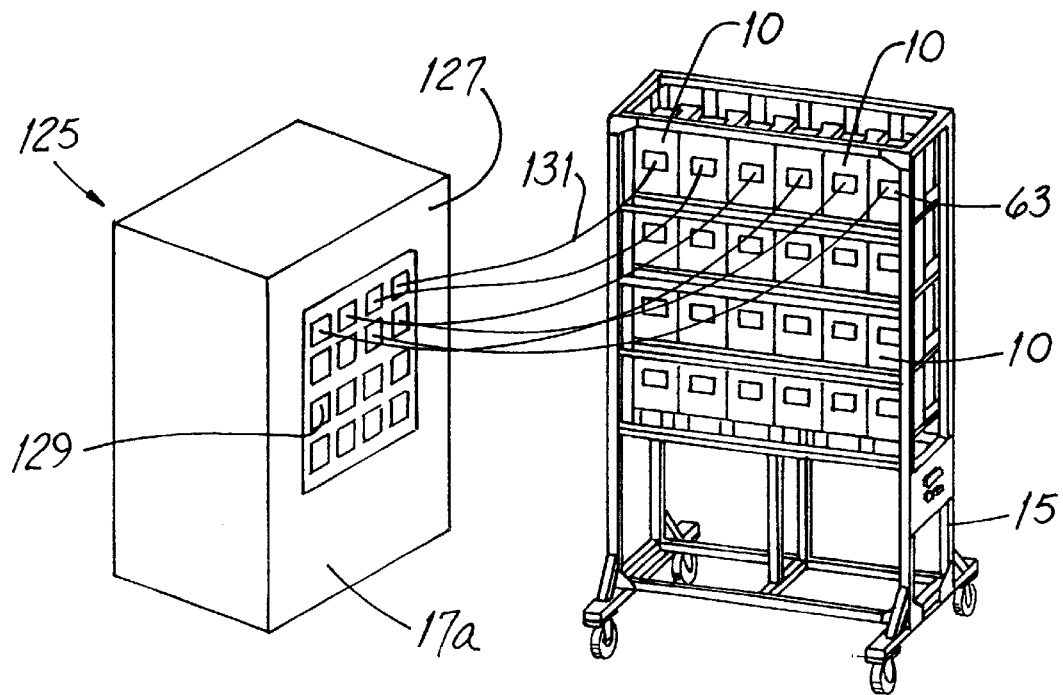
FIG. 11 is a perspective view of another type of exemplary cart-based circuit board test system with which the new transfer switch may be used.

Referring next to FIGS. 2, 3 and 11 another aspect of the invention involves the combination of (a) a cart 15, (b) a plurality of transfer switches 10 mounted on the cart 15, and (c) an environmental test chamber 17*a* containing circuit boards 13 to be tested. Such circuit boards 13 are loaded from the side 125 of the chamber 17*a*.

Preferably opposite the side 125, the test chamber 17*a* includes a wall 127 having a plurality of sockets 129 mounted thereon. The cart 15 and its transfer switches 10 are spaced from the chamber 17*a* and there is a separate cable harness 131 extending between each socket 129 and a respective transfer switch 10. In one specific embodiment, each cable harness 131 connects to a separate terminal matrix 63 on a respective transfer switch 10.

In another specific embodiment apparent from FIG. 10 and the related description, (configured to reduce contact resistance to a minimum), each cable harness 131 is "hard-wired" and connects directly to the lugs 99 on the platform 47 of a separate switch 10 without using an intervening terminal matrix 63. (Depending upon the specific test arrangement, the number of switches 10 on the cart 15 or actually in use may or, as shown in FIG. 11, may not be equal to the number of sockets.)

Another aspect of the invention involves a new method for testing printed circuit boards 13. Such method includes the steps of providing a transfer switch 10 electrically connected to the circuit boards 13 and having a platform 47 mounted for reciprocating movement between a first position 83 and a second position 85. Also provided are first and second test devices 33, 35 which are fixed with respect to the platform 47. The platform 47 is moved to the first position 83, thereby connecting the circuit boards 13 to the first test device 33 and then such platform 47 is moved the second position 85, thereby connecting the circuit boards 13 to the second test device 35.

In a more specific aspect of the method, the platform 47 includes a plurality of lugs 99 supported thereon. The switch 10 includes an input terminal matrix 63 fixed with respect to the platform 47. Wires 119 extend between the matrix 63 and the lugs 99 and, noting FIGS. 3 and 10, the first moving step includes flexing the wires 119 in a first direction, e.g., upwardly. The second moving step includes flexing the wires 119 in a second direction, e.g., downwardly.

Minimized wire flexure is an advantage of the new switch 10 and the new method related thereto. The wires 119 include a first wire (wire 119 and FIG. 3) extending along a first wire axis 135 when the platform 47 is in the first position 83 and extending along a second wire axis 137 when the platform 47 is in the second position 85. Both wire axes 135, 137 are slightly angular with respect to the switch long axis 139. The included angle A1 between the wire axes 135, 137 is less than about 10°. And depending upon the length of the switch 10 and the particular wire 119 being considered, the including angle Al between the wire axes 135, 137 may be even less than 5° or so.

In yet another aspect of the new method, the first moving step includes repositioning the movable platform connectors 101, 103 along an axis 141 coincident with the stationary connectors 49 and 51 and with the movable connectors 101 and 103. And most preferably, the platform 47 is reciprocated in two directions, e.g.,n directly upward and directly downward, which are 180° apart.

As used herein, such terms as "upward" and "downward" are for convenience in explanation. It should be understood that the new switch 10 is capable of operating in any position.

While the principles of the invention have been shown and described in connection with a few preferred embodiments, it is to be understood clearly that such embodiments are by way of example and are not limiting.

What is claimed:

1. A transfer switch for testing printed circuit boards associated with an environmental test chamber and including:

a frame comprising first and second spaced-apart mounting members;

first and second stationary connectors supported by the first and second mounting members, respectively;

a platform between the mounting members and including first and second movable connectors thereon, such platform being supported by the frame for powered, linear reciprocating movement by an actuator, such movement being between a first position engaging the first connectors with one another and a second position engaging the second connectors with one another.

2. The switch of claim 1 wherein:

the mounting members have at least one guide post extending therebetween; and the platform moves along the guide post under the urging of the actuator.

3. The switch of claim 2 wherein:

the mounting members have a plurality of guide posts extending therebetween;

the guide posts are generally parallel to one another; and the platform moves along the guide posts under the urging of the actuator.

4. The switch of claim 2 wherein the actuator extends between the first mounting member and the platform for moving the platform between the first and second positions.

5. The switch of claim 4 wherein the actuator includes:

a body fixed with respect to the first mounting member; and a reciprocating portion extending between the body and the platform.

6. The switch of claim 1 wherein:

the platform includes a pair of spaced-apart mounting plates and a substrate supported by at least one of the plates;

the substrate has a plurality of lugs mounted thereon; and each lug comprising the plurality of lugs is electrically coupled to the movable connectors.

7. The switch of claim 6 including an input terminal matrix and each lug comprising the plurality of lugs is electrically coupled to the matrix.

8. The switch of claim 1 including a terminal matrix supported by the frame and wherein:

the platform includes a substrate having a wiring lug thereon:

a wire extends from the wiring lug to the terminal matrix;

the wire is along a first wire axis when the platform is in the first position and is along a second wire axis when the platform is in the second position; and the included angle between the wire axes is not greater than 10°.

9. The transfer switch of claim 1 in combination with (a) a cart, and (b) a test chamber containing at least one printed circuit board and having a wall with a socket mounted thereon and connected to the printed circuit board, and wherein:

the cart supports the transfer switch;

the transfer switch includes a terminal matrix supported by the frame;

the first movable connector is wired to the terminal matrix; and a cable harness extends between the terminal matrix and the socket, thereby connecting the first movable connector to the printed circuit board.

10. The transfer switch of claim 1 in combination with a cart, and wherein:

the cart supports the transfer switch and includes a fixture supporting at least one printed circuit board;

the transfer switch includes a terminal matrix;

the first movable connector is wired to the terminal matrix; and the printed circuit board is plug-connected to the terminal matrix, thereby connecting the printed circuit board to the first movable connector.

* * * * *